United States Patent
Peng et al.

(10) Patent No.: US 9,482,797 B2
(45) Date of Patent: Nov. 1, 2016

(54) PIXEL ARRAY, CAMERA USING THE SAME AND COLOR PROCESSING METHOD BASED ON THE PIXEL ARRAY

(71) Applicants: SHENZHEN BYD AUTO R&D COMPANY LIMITED, Shenzhen, Guangdong (CN); BYD COMPANY LIMITED, Shenzhen, Guangdong (CN)

(72) Inventors: Mao Peng, Guangdong (CN); Jingjun Fu, Guangdong (CN); Wenge Hu, Guangdong (CN)

(73) Assignees: BYD Company Limited, Shenzhen, Guangdon (CN); Shenzhen BYD Auto R&D Company Limited, Shenzhen, Guangdong (CN)

( * ) Notice: Subject to any disclaimer, the term of this patent is extended or adjusted under 35 U.S.C. 154(b) by 310 days.

(21) Appl. No.: 14/186,936

(22) Filed: Feb. 21, 2014

(65) Prior Publication Data

US 2014/0168446 A1    Jun. 19, 2014

Related U.S. Application Data

(63) Continuation of application No. PCT/CN2012/080620, filed on Aug. 27, 2012.

(30) Foreign Application Priority Data

Aug. 30, 2011    (CN) .......................... 2011 1 0252562

(51) Int. Cl.
*H04N 5/33*    (2006.01)
*G02B 5/20*    (2006.01)
(Continued)

(52) U.S. Cl.
CPC ......... *G02B 5/201* (2013.01); *H01L 27/14621* (2013.01); *H04N 9/045* (2013.01); *H04N 9/07* (2013.01); *H01L 27/14625* (2013.01)

(58) Field of Classification Search
CPC ............ G02B 5/201; H01L 27/14621; H01L 27/14625; H04N 9/045; H04N 9/07
USPC .......................................................... 348/164
See application file for complete search history.

(56) References Cited

U.S. PATENT DOCUMENTS 6,137,100 A    10/2000    Fossum et al.
6,346,969 B1    2/2002    Kwon
(Continued)

FOREIGN PATENT DOCUMENTS

| CN | 1561112 A | 1/2005 |
| CN | 101478687 A | 7/2009 |
| CN | 101489142 A | 7/2009 |
| EP | 2117047 A1 | 11/2009 |

(Continued)

OTHER PUBLICATIONS

PCT International Search Report and Written Opinion mailed Nov. 29, 2012, issued in International Application No. PCT/CN2012/080620 (10 pages).

*Primary Examiner* — Mehrdad Dastouri
*Assistant Examiner* — Jared Walker
(74) *Attorney, Agent, or Firm* — Finnegan, Henderson, Farabow, Garrett & Dunner, LLP

(57) ABSTRACT

A pixel array is provided. The pixel array comprises a plurality of two-dimensionally arranged 4*4 Bayer matrix units, in which the matrix unit comprises a plurality of pixels, any of a green filter, a red filter and a blue filter is disposed in one pixel, and one or more of the green filters are replaced by white color filters in the matrix units. A camera using the same and a color processing method based on the pixel array are also provided.

8 Claims, 4 Drawing Sheets

(51) Int. Cl.
*H04N 9/04* (2006.01)
*H04N 9/07* (2006.01)
*H01L 27/146* (2006.01)

(56) References Cited

U.S. PATENT DOCUMENTS

| | | | |
|---|---|---|---|
| 2009/0128529 A1* | 5/2009 | Izumi | G02F 1/13318 345/207 |
| 2009/0200451 A1* | 8/2009 | Conners | H04N 5/2351 250/208.1 |
| 2009/0285476 A1 | 11/2009 | Choe et al. | |
| 2010/0295947 A1* | 11/2010 | Boulanger | H04N 9/045 348/164 |
| 2011/0012011 A1* | 1/2011 | Jung | G02F 1/133514 250/208.1 |
| 2011/0085063 A1* | 4/2011 | Min | H04N 5/332 348/280 |

FOREIGN PATENT DOCUMENTS

| | | |
|---|---|---|
| JP | 2007-043427 A | 2/2007 |
| JP | 2009-081738 A | 4/2009 |
| WO | WO 2013/029516 A1 | 3/2013 |

* cited by examiner

PIXEL ARRAY, CAMERA USING THE SAME AND COLOR PROCESSING METHOD BASED ON THE PIXEL ARRAY

CROSS-REFERENCE TO RELATED APPLICATION

This application is a continuation application of International Application No. PCT/CN2012/080620, filed Aug. 27, 2012, which claims priority to, and benefits of Chinese Patent Application Serial No. 201110252562.1, filed with the State Intellectual Property Office of P. R. China on Aug. 30, 2011. The entire contents of the above-referenced applications are incorporated herein by reference.

TECHNICAL FIELD

Exemplary embodiments of the present disclosure relate generally to a digital image processing field, and more particularly, to a pixel array, a camera using the same and a color processing method based on the pixel array.

BACKGROUND

To improve image quality captured in a dim environment, an application of an invisible light is taken into account for most cameras. Known applications are mainly divided into two types: single lens and double lens.

For the single lens, one dual lens or one full-spectrum lens that allows an infrared light to pass through is applied. The image quality in night may be improved, but a color distortion of the image in day may be caused because of absorption of infrared energy, for example, a black cloth will became reddish in the image.

For the double lens, one camera is equipped with two types of lenses. In a strong light environment (for example in day), an ordinary lens that allows a visible light to pass through is used; and in a weak light environment (for example in night), the dual lens or the full-spectrum lens that allows the infrared light to pass through is used. According to the above methods, the image color in an ordinary environment may be reproduced and the image quality in night may be improved. But it is required to switch between the two lenses in different environments, which makes an usage of the lens complicated, a cost over high and the usage unstable.

A Bayer matrix is currently used in the above lens. FIG. 1 shows a 4*4 Bayer matrix unit. As shown in FIG. 1, a pixel block A comprises pixels 1', 2', 3' and 4'. R, G and B represent a red filter, a green filter and a blue filter respectively. The blue filter B is disposed in the pixel 1', the green filters G are disposed in the pixel 2' and 3' respectively, and the red filter R is disposed in the pixel 4'.

SUMMARY

According to one exemplary embodiment of the present disclosure, a pixel array is provided to improve the image quality. The pixel array comprises a plurality of two-dimensionally arranged 4*4 Bayer matrix units, wherein the matrix unit comprises a plurality of pixels, any of a green filter, a red filter, and a blue filter are disposed in one pixel, and one or more of the green filters are replaced by white filters in the matrix units.

According to one exemplary embodiment of the present disclosure, a camera is also provided. The camera comprises a lens which comprises a plurality of two-dimension arranged 4*4 Bayer matrix units, wherein the matrix unit comprises a plurality of pixels, any of a green filter, a red filter and a blue filter is disposed in one pixel, and one or more of the green filters are replaced by white filters in the matrix units.

According to another exemplary embodiment of the present disclosure, a color processing method based on the pixel array is also provided. The color processing method based on the pixel array comprises: obtaining a first pixel value with an infrared component of a color in each pixel when a light comprising an infrared composition passes through the green filter, the red filter, the blue filter or the white filter; interpolating for the first pixel value with the infrared component in each pixel to obtain a second pixel value with an infrared component of a missing color in each pixel; obtaining an infrared component value of each pixel according to the first pixel value and the second pixel values; and obtaining a third pixel value not affected by the infrared component value of the colors in each pixel according to the first pixel value, the second pixel values and the infrared component value.

In the pixel array, one or more of the green filters are replaced by the white color filters. Because the sensitivity of a white filter is higher than a red filter, a green filter and a blue filter, the image quality may be improved, the pixel value with an infrared component may be provided and the infrared component value may be obtained separately. Therefore by removing the infrared component value from the pixel value when the image is taken in day, the image quality may not be affected by the infrared composition, and thus the real color of the image in ordinary environment may be reproduced. Only one lens is needed to improve the image quality in night and to reproduce the real color of the image in day, which is convenient and with low cost.

BRIEF DESCRIPTION OF THE DRAWINGS

Figure 1:
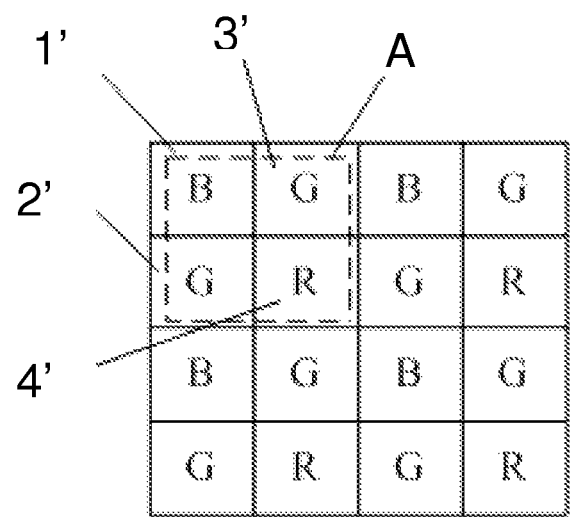
Figure 2:
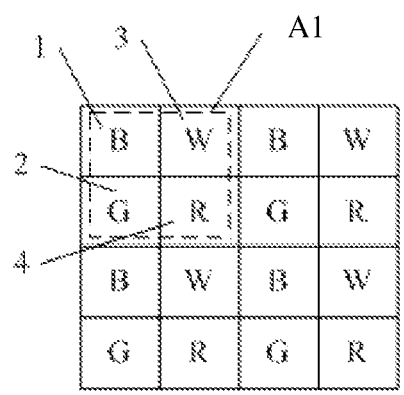
Figure 3:
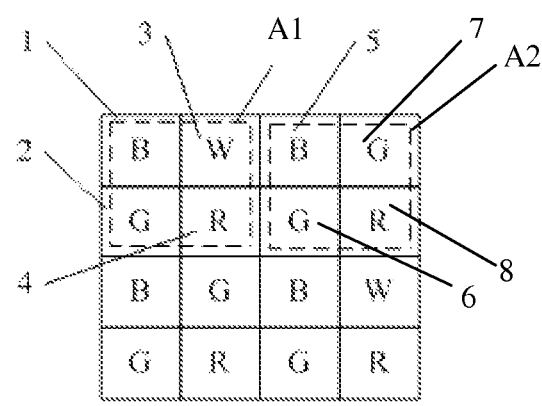
Figure 4:
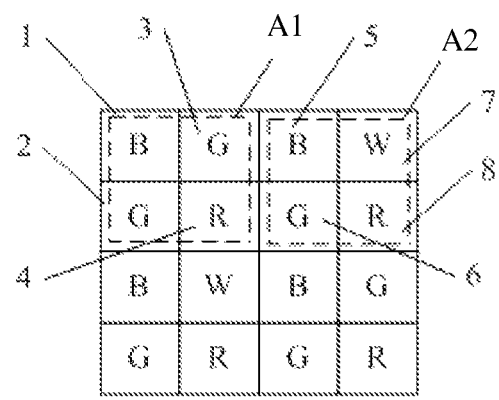
Figure 5:
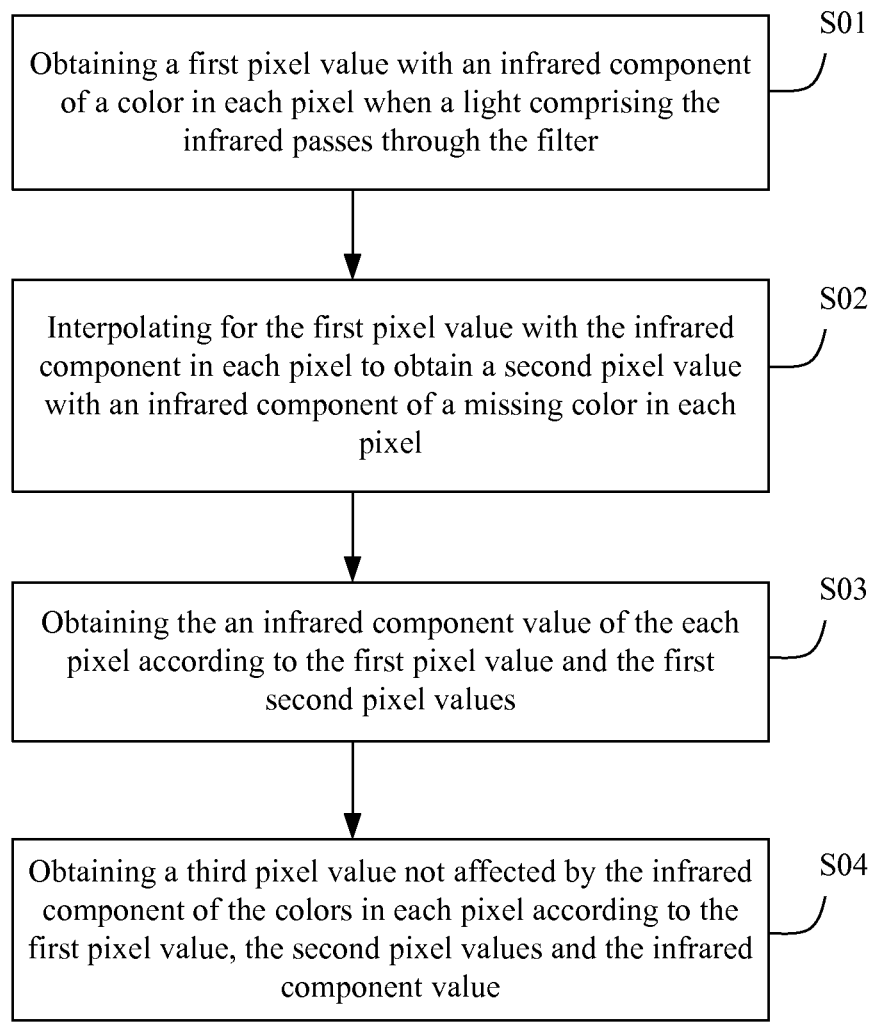

Having thus described example embodiments of the present disclosure in general terms, reference will now be made to the accompanying drawings, which are not necessarily drawn to scale, and wherein:

FIG. 1 illustrates a Bayer pixel matrix according to the prior art;

FIG. 2 illustrates a schematic diagram of a pixel array according to one exemplary embodiment of the present disclosure;

FIG. 3 illustrates a schematic diagram of a pixel array according to one exemplary embodiment of the present disclosure;

FIG. 4 illustrates a schematic diagram of a pixel array according to one exemplary embodiment of the present disclosure; and FIG. 5 illustrates a flow chart of a color processing method based on a pixel array according to one exemplary embodiment of the present disclosure.

DETAILED DESCRIPTION

The present disclosure now will be described more fully hereinafter with reference to the accompanying drawings, in which preferred embodiments of the disclosure are shown. This disclosure may, however, be embodied in many different forms and should not be construed as limited to the embodiments set forth herein; rather, these embodiments are provided so that this disclosure will be thorough and complete, and will fully convey the scope of the disclosure to those skilled in the art.

In some embodiment of the present disclosure, a pixel array comprises a plurality of two-dimensionally arranged 4*4 Bayer matrix units. The matrix unit comprises a plurality of pixels, in which any one of a green filter, a red filter and a blue filter is disposed in one pixel, and one or more of the green filters are selectively replaced by white filters in the matrix unit.

In the pixel array, one or more of the green filters are replaced by the white filters. Because the sensitivity of the white filter is higher than that of the red filter, the green filter and the blue filter, the image quality may be improved, the pixel value with an infrared component may be provided and the infrared component value may be obtained separately.

FIG. 2 shows a 4*4 Bayer matrix unit 100 according to one embodiment of the present disclosure. A pixel block A1 comprises pixels 1, 2, 3 and 4. R, G, B and W represent the red filter, the green filter, the blue filter and the white filter respectively. The blue filter B is disposed in the pixel 1, the green filter G is disposed in the pixel 2, the white filter W is disposed in the pixel 3, and the red filter R is disposed in the pixel 4. That is, one green filter is replaced by the white filter in the pixel block A1, so that, in the pixel block, the density of the white filter is the same as the density of the green filter, the red filter or the blue filter. Also, the density of the white color filters is the same as the density of the green filters, the red filters or the blue filters in the matrix unit 100. The white filter is the one that almost can allow the full-spectrum light to pass through. In some embodiments of the present disclosure, for the pixel block A1, a red filter R may be disposed in the pixel 1, and a blue filter B may be disposed in the pixel 4. That is, the filters disposed in the pixels 1 and 4 may be exchanged. In some embodiments of the present disclosure, the green filter G may be disposed in the pixel 3, and the white filter W may be disposed in the pixel 2. That is, the filters disposed in the pixels 2 and 3 may be exchanged.

In some embodiments of the present disclosure, one or more of the green filters in one matrix unit may be replaced by the white filters, so that the density of the white filters is lower than the density of the red filters or the blue filters. A 4*4 Bayer matrix unit 200 according to one embodiment of the present disclosure is shown in FIG. 3. As shown in FIG. 3, the 4*4 Bayer matrix unit 200 comprises pixel blocks A1 and A2. The pixel block A1 comprises pixels 1, 2, 3 and 4. R, G, B and W represent the red filter, the green filter, the blue filter and the white filter respectively. The blue filter is disposed in the pixel 1, the green filter is disposed in the pixel 2, the white filter is disposed in the pixel 3 and the red filter is disposed in the pixel 4. The pixel block A2 comprises pixels 5, 6, 7 and 8. The blue filter is disposed in the pixel 5, the green filters are disposed in the pixels 6 and 7, and the red filter is disposed in the pixel 8, so that the ratios between the white filters W and the red filters R, between the white filters W and the green filters G, and between the white filters W and the blue filters B in the matrix unit 200 are 1:2 respectively. In this embodiment, there are only two white filters in the matrix unit 200 as shown in FIG. 3, which makes it more precise and easier to obtain a pixel value with an infrared component and to interpolate for the pixel value to get the interpolation result.

In some embodiments of the present invention, referring to FIG. 4, a 4*4 Bayer matrix unit 300 comprises the pixel blocks A1 and A2. The pixel block A1 comprises pixels 1, 2, 3 and 4. R, G, B and W represent the red filter, the green filter, the blue filter and the white filter respectively. The blue filter is disposed in the pixel 1, the green filters are disposed in the pixels 2 and 3, and the red filter is disposed in the pixel 4. The pixel block A2 comprises pixels 5, 6, 7 and 8. The blue filter is disposed in the pixel 5, the green filter is disposed in the pixel 6, the white filter is disposed in the pixel 7, and the red filter is disposed in the pixel 8. In some embodiments of the present disclosure, the red filter R may be disposed in the pixel 1, and the blue filter B may be disposed in the pixel 4. That is, the filters disposed in the pixels 1 and 4 may be exchanged. Similarly, the filters disposed in the pixels 2 and 3 may be exchanged. In some embodiments of the present disclosure, the red filter R may be disposed in the pixel 5, and the blue filter B may be disposed in the pixel 8. That is, the filters disposed in the pixels 5 and 8 may be exchanged.

In some embodiments of the present disclosure, a camera is provided. The camera comprises a lens including a plurality of two-dimensionally arranged 4*4 Bayer matrix units. The matrix unit comprises a plurality of pixels, in which any of a green filter, a red filter and a blue filter is disposed in one pixel, and one or more of the green filters are replaced by white color filters in the matrix units.

As mentioned above, in the pixel array, one or more of the green filters are replaced by the white color filters. Because the sensitivity of the white filter is higher than that of the red filter, the green filter and the blue filter, the image quality may be improved, the pixel value with an infrared component may be provided, and the infrared component value may be obtained separately. Therefore, by removing the infrared component value from the pixel value when the image is taken in day, the image quality may not be affected by the infrared composition, and thus the real color of the image in an ordinary environment may be reproduced. Only one lens is needed to improve the image quality in night and to reproduce the real color of the image in day, which is convenient and with low cost.

In some embodiments of the present disclosure, a color processing method based on the pixel array mentioned above is provided. Referring to FIG. 5, the method comprises the following steps: S01, obtaining a first pixel value with an infrared component of a first color of each pixel when a light comprising an infrared composition passes through the green filter, the red filter, the blue filter or the white filter; S02, interpolating for the first pixel value with the infrared component of the first color of each pixel to obtain a second pixel value with an infrared component of a color different from the first color of each pixel; S03, obtaining an infrared component value of each pixel according to the first pixel value and the second pixel values; and S04, obtaining a third pixel value not affected by the infrared component value of each pixel according to the first pixel value, the second pixel values and the infrared component value.

At step S01, when the light with the infrared component passes through the filter (the filter refers to one of the green filter, the red filter, the blue filter or the white filter), the filter disposed in the pixel absorbs the light of the corresponding spectrum, and the first pixel value with the infrared component of a color of each pixel may be obtained according to the following formulas:

$$R'=R+a*IR; \qquad (2\text{-}1)$$

$$G'=G+b*IR; \qquad (2\text{-}2)$$

$$B'=B+c*IR; \qquad (2\text{-}3)$$

$$W'=(R/a+G/b+B/c+IR)*d; \qquad (2\text{-}4).$$

In the above formulas, a is the gain value of the red filter, b is the gain value of the green filter, c is the gain value of the blue filter, d is the gain value of the white filter, and IR is the infrared component value; R is the pixel value of the pixel disposed with the red filter (i.e. the third pixel value not affected by the infrared component value of the pixel), and R' is the first pixel value of the red color with the infrared component of the pixel disposed with the red filter; G is the pixel value of the pixel disposed with the green filter (i.e., the third pixel value not affected by the infrared component value of the pixel), and G' is the first pixel value of the green color with the infrared component of the pixel disposed with the green filter; B is the pixel value of the pixel disposed with the blue filter (i.e., the third pixel value not affected by the infrared component value of the pixel), and B' is the first pixel value of the blue color with the infrared component of the pixel disposed with the blue filter; W is the pixel value of the pixel disposed with the white filter (i.e., the third pixel value not affected by the infrared component value of the pixel), and W' is the first pixel value of the white color with the infrared component of the pixel disposed with the white filter.

At step S02, interpolating for the first pixel value with the infrared component in each pixel, the missing pixel values (i.e., the second pixel values with the infrared component of a missing color) of each pixel may be obtained. The interpolation algorithm comprises adjacent point interpolation, bilinear interpolation, edge oriented interpolation, tone local single putative interpolation and edge and tone conjunct interpolation, etc. In this embodiment of the present disclosure, according to the interpolation algorithm, a second pixel value of the missing color in each pixel is obtained by calculating an average value of the first or second pixel values of the color having the same color with the missing color in adjacent pixels. The interpolation algorithm is described in detail as follows.

When the first pixel value with the infrared component of the red color of the pixel is R'(i,j), a second pixel value with an infrared component of a missing color in the pixel is calculated according to the following formulas:

$$G'(i,j)=\frac{1}{2}*(G'(i,j-1)+G'(i,j+1));$$

$$B'(i,j)=\frac{1}{4}*(B'(i-1,j-1)+B'(i-1,j+1)+B'(i+1,j-1)+B'(i+1,j+1));\text{ and}$$

$$W'(i,j)=\frac{1}{2}*(W'(i-1,j)+W'(i+1,j)).$$

In the above formulas, i is the row number of the pixel array and j is the column number of the pixel array.

For example, when the first pixel value with the infrared component of the red color of the pixel is R' (2, 2), that is i=2, j=2, a second pixel value with an infrared component of the missing color in the pixel is calculated according to the following formulas:

$$G'(2,2)=\frac{1}{2}*(G'(2,1)+G'(2,3));$$

$$B'(2,2)=\frac{1}{4}*(B'(1,1)+B'(1,3)+B'(3,1)+B+(3,3));\text{ and}$$

$$W'(2,2=\frac{1}{2}*(1,2)+W'(3,2)).$$

When the first pixel value with the infrared component of the green color of the pixel is G'(i,j), a second pixel value with an infrared component of a missing color in the pixel is calculated according to the following formulas:

$$R'(i,j)=\frac{1}{2}*(R'(i,j-1)+R'(i,j+1));$$

$$B'(i,j)=\frac{1}{2}*(B'(i-1,j)+B'(i+1,j));\text{ and}$$

$$W'(i,j)=\frac{1}{4}*(W'(i-1,j-1)+W'(i-1,j+1)+W'(i+1,j-1)+W'(i+1,j+1)).$$

For example, when the first pixel value with the infrared component of the green color of the pixel is G' (2, 3), that is i=2, j=3, a second pixel value with an infrared component of the missing color in the pixel is calculated according to the following formulas:

$$R'(2,3)=\frac{1}{2}*(R'(2,2)+R'(2,4));$$

$$B'(2,3=\frac{1}{2}*(B'(1,3)+B'(2,3));\text{ and}$$

$$W'(2,3)=\frac{1}{4}*(W'(1,2)+W'(1,4)+W'(3,2)+W'*(3,4)).$$

When the first pixel value with the infrared component of the blue color of the pixel is B'(i,j), a second pixel value with an infrared component of a missing color in the pixel is calculated according to the following formulas:

$$R'(i,j)=\frac{1}{4}*(R'(i-1,j-1)+R'(i-1,j+1)+R'(i+1,j-1)+R'(i+1,j+1));$$

$$G'(i,j)=\frac{1}{2}*(G'(i-1,j)+G'(i+1,j));\text{ and}$$

$$W'(i,j)=\frac{1}{2}*(W'(i,j-1)+W(i,j+1)).$$

For example, when the first pixel value with the infrared component of the blue color of the pixel is B' (2, 3), that is i=3, j=3, a second pixel value with an infrared component of the missing color in the pixel is calculated according to the following formulas:

$$R'(3,3)=\frac{1}{4}*(R'(2,2)+R'(2,4)+R'(4,2)+R'(4,4));$$

$$G'(3,3)=\frac{1}{2}*(G'(2,3)+G'(4,3));\text{ and}$$

$$W'(3,3)=\frac{1}{2}*(W'(3,2)+W(3,4)).$$

When the first pixel value with the infrared component of the white color of the pixel is W'(i,j), a second pixel value with an infrared component of a missing color in the pixel is calculated according to the following formulas:

$$R'(i,j)=\frac{1}{2}*(R'(i-1,j)+R'(i+1,j));$$

$$G'(i,j)=\frac{1}{4}*(G'(i-1,j-1)+G'(i-1,j+1)+G'(i+1,j-1)+G'(i+1,j+1));\text{ and}$$

$$B'(i,j)=\frac{1}{2}*(B'(i,j-1)+B'(i,j+1)).$$

For example, when the first pixel value with the infrared component of the white color of the pixel is W' (2, 3), that is i=3, j=2, a second pixel value with an infrared component of the missing color in the pixel is calculated according to the following formulas:

$$R'(3,2)=\frac{1}{2}*(R'(2,2)+R'(4,2));$$

$$G'(3,2)=\frac{1}{4}*(G'(2,1)+G'(2,3)+G'(4,1)+G'(4,3));\text{ and}$$

$$B'(3,2)=\frac{1}{2}*(B'(3,1)+B'(3,3)).$$

When the pixel is the edge pixel, the second pixel values of the missing color in each pixel may be equal to the first or second pixel value of the color having the same color with the missing color of one adjacent pixel. For example, when the first pixel value with the infrared component of the blue color of the pixel is B' (1, 1), the second pixel values of the missing color are R'(1, 1)=R'(2, 2); G'(1, 1)=G'(2, 1); and W'(1, 1)=W'(1, 2).

At step S03, the infrared component value of each pixel may be obtained according to the pixel value of each color (that is, the first pixel value and the second pixel values) and the formulas (2-1) to (2-4). The infrared component may be calculated according to the formula: $IR(i,j)=-(1/d*W(i,j)'-1/a*R(i,j)'-1/b*G(i,j)'-1/c*B(i,j)')/2.$ At step S04, the third pixel value not affected by the infrared component of each pixel may be obtained according to the first pixel value, the second pixel values, and the infrared component value. Specifically, the third pixel value may be obtained by substituting the infrared component value into the formulas (2-1) to (2-3). The third pixel value not affected by the infrared component in each pixel is calculated according to the following formulas:

$$R(i,j)=(R(i,j)'+a/d*W(i,j)'-a/b*G(i,j)'-a/c*B(i,j)')/2;$$

$$G(i,j)=(G(i,j)'+b/d*W(i,j)'-b/a*R(i,j)'-b/c*B0')/2; \text{ and}$$

$$B(i,j)=(B(i,j)'+c/d*W(i,j)'-c/a*R(i,j)'-c/b*G(i,j)')/2.$$

In the above formulas, a is the gain value of the red filter, b is the gain value of the green filter, c is the gain value of the blue filter, and d is the gain value of the white filter.

It will be appreciated by those skilled in the art that changes could be made to the examples described above without departing from the broad inventive concept. It is understood, therefore, that this disclosure is not limited to the particular examples disclosed, but it is intended to cover modifications within the spirit and scope of the present disclosure as defined by the appended claims.

What is claimed is:

1. A pixel array used for performing color processing, comprising:
    a plurality of two-dimensionally arranged 4*4 Bayer matrix units, wherein the matrix unit comprises a plurality of pixels, each pixel including any of a green filter, a red filter and a blue filter, and one or more of the green filters are replaced by white filters in the matrix units, wherein:
        a first pixel value with an infrared component of a color in each pixel is obtained, when a light comprising an infrared composition passes through the green filter, the red filter, the blue filter or the white filter;
        a second pixel value with an infrared component of a mission color in each pixel is obtained, by interpolating for the first pixel value with the infrared component in each pixel;
        an infrared component value of each pixel is obtained, according to the first pixel value and the second pixel value; and
        a third pixel value not affected by the infrared component of the colors in each pixel is obtained, according to the first pixel value, the second pixel value and the infrared component value; wherein
            when the light comprising the infrared composition passes through the red filter, the first pixel value with the infrared component of a red color is $R'=R+a*IR$;
            when the light comprising the infrared composition passes through the green filter, the first pixel value with the infrared component of a green color is $G'=G+b*IR$;
            when the light comprising the infrared composition passes through the blue filter, the first pixel value with the infrared component of a blue color is $B'=B+c*IR$; and
            when the light comprising the infrared composition passes through the white color filter, the first pixel value with the infrared component of a white color is $W'=(R/a+G/b+B/c+IR)*d$,
            where a is a gain value of the red filter, b is a gain value of the green filter, c is a gain value of the blue filter, d is a gain value of the white filter, and IR is the infrared component value, R is the pixel value of the pixel disposed with the red filter, and R' is the first pixel value of the red color with the infrared component of the pixel disposed with the red filter; G is the pixel value of the pixel disposed with the green filter, and G' is the first pixel value of the green color with the infrared component of the pixel disposed with the green filter; B is the pixel value of the pixel disposed with the blue filter, and B' is the first pixel value of the blue color with the infrared component of the pixel disposed with the blue filter; W is the pixel value of the pixel disposed with the white filter, and W' is the first pixel value of the white color with the infrared component of the pixel disposed with the white filter.

2. The pixel array of claim 1, wherein a density of the white filter is the same as a density of the green filter or the red filter or the blue filter in the matrix units.

3. The pixel array of claim 1, wherein a density of the white filter is less than a density of the red filter or the blue filter in the matrix units.

4. A camera, comprising:
    a lens which comprises a plurality of two-dimensionally arranged 4*4 Bayer matrix units used for performing color processing,
    wherein the matrix unit comprises a plurality of pixels, each pixel including any of a green filter, a red filter and a blue filter, and one or more of the green filters are replaced by white filters in the matrix units, wherein:
        a first pixel value with an infrared component of a color in each pixel is obtained, when a light comprising an infrared composition passes through the green filter, the red filter, the blue filter or the white filter;
        a second pixel value with an infrared component of a missing color in each pixel is obtained, by interpolating for the first pixel value with the infrared component in each pixel;
        an infrared component value of each pixel is obtained, according to the first pixel value and the second pixel value; and
        a third pixel value not affected by the infrared component of the colors in each pixel is obtained, according to the first pixel value, the second pixel value and the infrared component value; wherein
            when the light comprising the infrared composition passes through the red filter, the first pixel value with the infrared component of a red color is $R'=R+a*IR$;
            when the light comprising the infrared composition passes through the green filter, the first pixel value with the infrared component of a green color is $G'=G+b*IR$;
            when the light comprising the infrared composition passes through the blue filter, the first pixel value with the infrared component of a blue color is $B'=B+c*IR$; and
            when the light comprising the infrared composition passes through the white color filter, the first pixel value with the infrared component of a white color is $W'=(R/a+G/b+B/c+IR)*d$,
            where a is a gain value of the red filter, b is a gain value of the green filter, c is a gain value of the blue filter, d is a gain value of the white filter, and IR is the infrared component value, R is the pixel value of the pixel disposed with the red filter, and R' is the first pixel value of the red color with the infrared component of the pixel disposed with the red filter; G is the pixel value of the pixel disposed with the green filter, and G' is the first pixel value of the green color with the infrared component of the pixel disposed with the green filter; B is the pixel value of the pixel disposed with the blue filter, and B' is the first pixel value of the blue color with the infrared component of the pixel disposed with the blue filter; W is the pixel value of the pixel disposed with the white filter, and W' is the first pixel value of the white color with the infrared component of the pixel disposed with the white filter.

5. A color processing method based on a pixel array, the pixel array comprising a plurality of two-dimensionally arranged 4*4 Bayer matrix units, wherein the matrix unit comprises a plurality of pixels, each pixel including any of a green filter, a red filter or a blue filter, and one or more of the green filters are replaced by white filters in the matrix units, the method comprising:

obtaining a first pixel value with an infrared component of a color in each pixel when a light comprising an infrared composition passes through the green filter, the red filter, the blue filter or the white filter;

interpolating for the first pixel value with the infrared component in each pixel to obtain a second pixel value with an infrared component of a missing color in each pixel;

obtaining an infrared component value of each pixel according to the first pixel value and the second pixel value; and obtaining a third pixel value not affected by the infrared component of the colors in each pixel according to the first pixel value, the second pixel value and the infrared component value; wherein, when the light comprising the infrared composition passes through the red filter, the first pixel value with the infrared component of a red color is R'=R+a*IR;

when the light comprising the infrared composition passes through the green filter, the first pixel value with the infrared component of a green color is G'=G+b*IR;

when the light comprising the infrared composition passes through the blue filter, the first pixel value with the infrared component of a blue color is B'=B+c*IR; and when the light comprising the infrared composition passes through the white color filter, the first pixel value with the infrared component of a white color is W'=(R/a+G/b+B/c+IR)*d, where a is a gain value of the red filter, b is a gain value of the green filter, c is a gain value of the blue filter, d is a gain value of the white filter, and IR is the infrared component value, R is the pixel value of the pixel disposed with the red filter, and R' is the first pixel value of the red color with the infrared component of the pixel disposed with the red filter; G is the pixel value of the pixel disposed with the green filter, and G' is the first pixel value of the green color with the infrared component of the pixel disposed with the green filter; B is the pixel value of the pixel disposed with the blue filter, and B' is the first pixel value of the blue color with the infrared component of the pixel disposed with the blue filter; W is the pixel value of the pixel disposed with the white filter, and W' is the first pixel value of the white color with the infrared component of the pixel disposed with the white filter.

6. The color processing method of claim 5, wherein the step of interpolating for the first pixel value with the infrared component of each pixel to obtain a second pixel value with an infrared component of a missing color in each pixel comprises:

when the first pixel value with the infrared component of a red color of the pixel is R'(i,j), a second pixel value with an infrared component of a missing color in the pixel is calculated according to the following formulas:

$$G'(i,j)=\tfrac{1}{2}*(G'(i,j-1)+G'(i,j+1));$$

$$B'(i,j)=\tfrac{1}{4}*(B'(i-1,j-1)+B'(i-1,j+1)+B'(i+1,j-1)+B'(i+1,j+1));\text{ and}$$

$$W'(i,j)=\tfrac{1}{2}*(W'(i-1,j)+W'(i+1,j));$$

when the first pixel value with the infrared component of the green color of the pixel is G'(i,j), a second pixel value with an infrared component of a missing color in the pixel is calculated according to the following formulas:

$$R'(i,j)=\tfrac{1}{2}*(R'(i,j-1)+R'(i,j+1));$$

$$B'(i,j)=\tfrac{1}{2}*(B'(i-1,j)+B'(i+1,j));\text{ and}$$

$$W'(i,j)=\tfrac{1}{4}*(W'(i-1,j-1)+W'(i-1,j+1)+W'(i+1,j-1)+W'(i+1,j+1));$$

when the first pixel value with the infrared component of the blue color of the pixel is B'(i,j), a second pixel value with an infrared component of a missing color in the pixel is calculated according to the following formulas:

$$R'(i,j)=\tfrac{1}{4}*(R'(i-1,j-1)+R'(i-1,j+1)+R'(i+1,j-1)+R'(i+1,j+1));$$

$$G'(i,j)=\tfrac{1}{2}*(G'(i-1,j)+G'(i+1,j));\text{ and}$$

$$W'(i,j)=\tfrac{1}{2}*(W(i,j-1)+W(i,j+1));$$

when the first pixel value with the infrared component of the white color of the pixel is W'(i,j), a second pixel value with an infrared component of a missing color in the pixel is calculated according to the following formulas:

$$R'(i,j)=\tfrac{1}{2}*(R'(i-1,j)+R'(i+1,j));$$

$$G'(i,j)=\tfrac{1}{4}*(G'(i-1,j-1)+G'(i-1,j+1)+G'(i+1,j-1)+G'(i+1,j+1));\text{ and}$$

$$B'(i,j)=\tfrac{1}{2}*(B'(i,j-1)+B'(i,j+1));$$

where i is a row number of the pixel array, and j is a column number of the pixel array.

7. The color processing method of claim 6, wherein the step of obtaining an infrared component value of each pixel according to the first pixel value and the second pixel values comprises calculating the infrared component value according to the formula of $IR(i,j)=-(1/d*W'(i,j)-1/a*R'(i,j)-1/g*G'(i,j)'-1/c*B'(i,j))/2$.

8. The color processing method of claim 7, wherein the step of obtaining a third pixel value not affected by the infrared component of the colors in each pixel according to the first pixel value, the second pixel values and the infrared component value comprises calculating the third pixel value of the colors according the following formulas:

$$R(i,j)=(R'(i,j)+a/d*W'(i,j)-a/b*G'(i,j)-a/c*B'(i,j))/2;$$

$$G(i,j)=(G'(i,j)+b/d*W'(i,j)-b/a*R'(i,j)-b/c*B'(i,j))/2;$$
and $$B(i,j)=(B'(i,j)+c/d*W'(i,j)-c/a*R'(i,j)-c/b*G'(i,j))/2.$$

* * * * *